United States Patent
Lee et al.

(10) Patent No.: US 11,289,028 B2
(45) Date of Patent: Mar. 29, 2022

(54) ORGANIC LIGHT EMITTING DISPLAY DEVICE AND DRIVING METHOD FOR THE SAME

(71) Applicant: LG Display Co., Ltd., Seoul (KR)

(72) Inventors: Botaek Lee, Paju-si (KR); Junho Bong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/116,512

(22) Filed: Dec. 9, 2020

(65) Prior Publication Data
US 2021/0193055 A1 Jun. 24, 2021

(30) Foreign Application Priority Data
Dec. 24, 2019 (KR) .......................... 10-2019-0173610

(51) Int. Cl.
*G09G 3/3291* (2016.01)
*H01L 27/32* (2006.01)

(52) U.S. Cl.
CPC ....... *G09G 3/3291* (2013.01); *H01L 27/3262* (2013.01); *H01L 27/3276* (2013.01); *G09G 2310/0272* (2013.01); *G09G 2310/08* (2013.01)

(58) Field of Classification Search
CPC .. G09G 3/3233; G09G 3/3291; G09G 3/3258; G09G 3/3225; G09G 3/3266; G09G 2300/0819; G09G 2300/0842; G09G 2300/0861; G09G 2310/0272; G09G 2310/08
See application file for complete search history.

(56) References Cited

U.S. PATENT DOCUMENTS

| 7,414,599 | B2* | 8/2008 | Chung | G09G 3/3233 345/76 |
|---|---|---|---|---|
| 10,692,434 | B2* | 6/2020 | Zhang | G09G 3/3208 |
| 10,825,391 | B2* | 11/2020 | Nam | G09G 3/3266 |
| 2005/0017934 | A1* | 1/2005 | Chung | G09G 3/3233 345/82 |
| 2012/0001893 | A1* | 1/2012 | Jeong | G09G 3/3233 345/213 |
| 2016/0035276 | A1* | 2/2016 | Yin | G09G 3/3225 345/78 |
| 2016/0042691 | A1* | 2/2016 | Na | G09G 3/3258 345/205 |
| 2016/0125802 | A1* | 5/2016 | Lee | G09G 3/3233 345/212 |
| 2021/0343238 | A1* | 11/2021 | Okabe | G09G 3/3233 |

* cited by examiner

*Primary Examiner* — Sardis F Azongha
(74) *Attorney, Agent, or Firm* — Fenwick & West LLP

(57) ABSTRACT

The present disclosure describes an organic light emitting display device including: a display panel including data lines, gate lines, emission lines, and pixels, a data driver applying data signals to the data lines, and a gate driver applying gate signals and emission signals to the gate lines and the emission lines, respectively. At least one of the pixels may be operated in a first period in which a data voltage is applied, a second period in which the data voltage is remained and a driving current is provided according to the data voltage, and a third period in which the data voltage is remained and light emitting is not performed, where a ratio between lengths of the second and third periods can be adjusted. The at least one pixel may receive a preset voltage in the second period and the third period.

17 Claims, 9 Drawing Sheets

ORGANIC LIGHT EMITTING DISPLAY DEVICE AND DRIVING METHOD FOR THE SAME

CROSS-REFERENCE TO RELATED APPLICATION

This application claims the priority benefit of Republic of Korea Patent Application No. 10-2019-0173610, filed on Dec. 24, 2019, which is incorporated by reference in its entirety.

BACKGROUND

1. Technical Field

The present disclosure relates to organic light emitting display devices and methods of driving the display device, and more specifically, to an organic light emitting display device capable of easily detecting defects and reducing manufacturing costs and a method of driving the display device.

2. Description of the Related Art

As the information society has developed at a rapid rate, there is an increasing need for display devices employing advanced technologies and more efficient methods. Recently, various types of display devices, such as a liquid crystal display (LCD) device, a quantum dot light emitting display (QLED) display, an organic light emitting display (OLED) device, or the like, have been developed and utilized.

SUMMARY

Typical organic light emitting display devices suffer from some defects that limit image quality of the displays due to a deviation in a threshold voltage of a transistor. Further, the variability of a data voltage used to display images leads a data voltage stored in a pixel to vary, and in turn, image quality to be deteriorated. To address these issues, the inventors of the present disclosure have invented an organic light emitting display device capable of improving image quality and a method of driving the organic light emitting display device.

Embodiments and examples of the present disclosure discussed below are not limited to solve the above issues; further other issues not described above will become apparent to those skilled in the art from the following detailed description.

In accordance with one aspect of the present disclosure, an organic light emitting display device is provided that includes: a display panel including a plurality of data lines, a plurality of gate lines, a plurality of emission lines, and a plurality of pixels, a data driver applying data signals to the plurality of data lines, a gate driver applying gate signals and emission signals to the plurality of gate lines and the plurality of emission lines, respectively, and, a timing controller controlling the data driver and the gate driver. Here, at least one of the plurality of pixels may be operated in a first period in which a data voltage is applied, a second period in which the data voltage is remained and a driving current is provided according to the data voltage, and a third period in which the data voltage is remained and light emitting is not performed, where a ratio between a length of the second period and a length of the third period can be adjusted. The pixel may receive a preset voltage in the second period and the third period.

In accordance with another aspect of the present disclosure, a method is provided of driving an organic light emitting display device including a pixel providing a driving current to an organic light emitting diode according to an applied data voltage, the method including: applying the data voltage to a first node, providing the driving current to the organic light emitting diode according to the applied data voltage, providing a preset voltage to the first node, and while the applied data voltage is remained and the driving current is not provided to the organic light emitting diode, providing the preset voltage to the first node.

In accordance with embodiments of the present disclosure, it is possible to provide an effect of improving image quality by compensating for a threshold voltage.

Further, by using the above organic light emitting display device and the method of driving the organic light emitting display device, it is possible to provide an effect of preventing image quality from being deteriorated due to a variance in a data voltage.

Effects of the present disclosure are not limited to the effects described above; further other effects will be apparent to those skilled in the art from the following detailed description. Further, embodiments of the present disclosure are not limited to the above description; further other embodiments, including variations thereof, will become apparent to those skilled in the art from the following detailed description.

DETAILED DESCRIPTION

Figure 1:
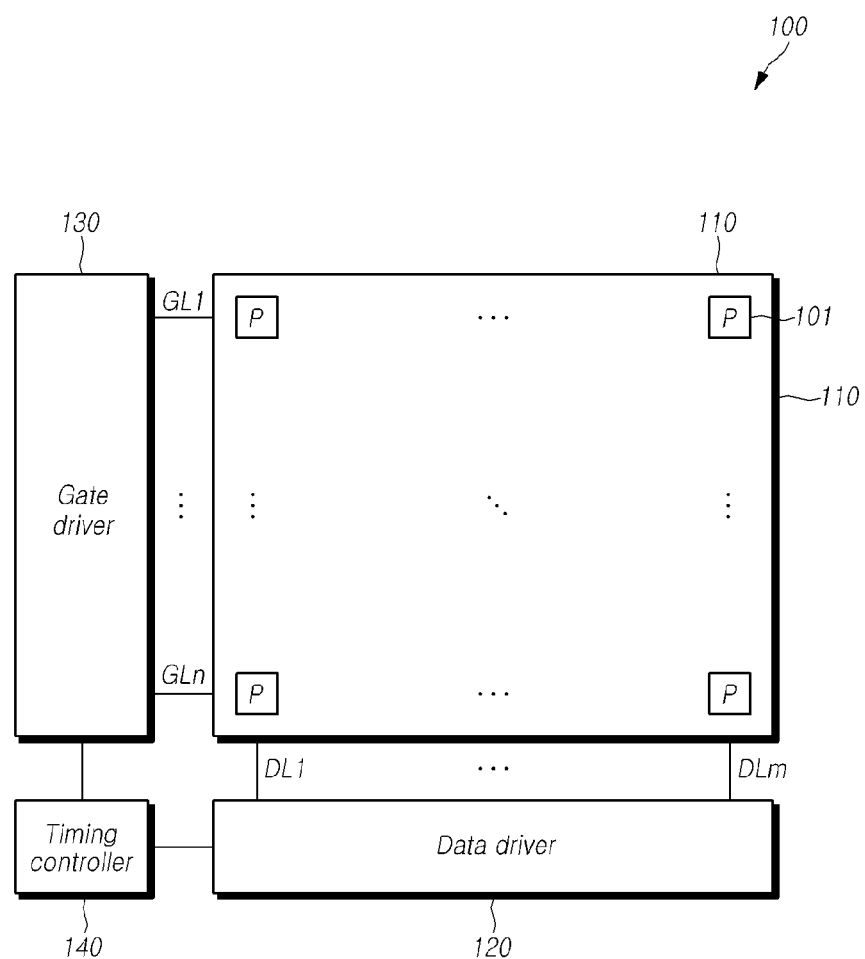
FIG. 1 illustrates a structure of an organic light emitting display device according to an embodiment of the present disclosure.

The advantages and features of the present disclosure and methods of achieving the same will be apparent by referring to embodiments of the present disclosure as described below in detail in conjunction with the accompanying drawings. However, the present disclosure is not limited to the embodiments set forth below, but may be implemented in various different forms. The following embodiments are provided only to completely disclose the present disclosure and inform those skilled in the art of the scope of the present disclosure, and the present disclosure is defined only by the scope of the appended claims.

In addition, the shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description of the present disclosure, detailed description of well-known functions and configurations incorporated herein will be omitted when it is determined that the description may make the subject matter in some embodiments of the present disclosure rather unclear. The terms such as "including", "having", "containing", and "comprising of" used herein are generally intended to allow other components to be added unless the terms are used with the term "only". Singular forms used herein are intended to include plural forms unless the context clearly indicates otherwise.

In interpreting any elements or features of the embodiments of the present disclosure, it should be considered that any dimensions and relative sizes of layers, areas and regions include a tolerance or error range even when a specific description is not conducted.

Spatially relative terms, such as, "on", "over", "above", "below", "under", "beneath", "lower", "upper", "near", "close", "adjacent", and the like, may be used herein to describe one element or feature's relationship to another element(s) or feature(s) as illustrated in the figures, and it should be interpreted that one or more elements may be further "interposed" between the elements unless the terms such as 'directly', "only" are used.

Time relative terms, such as "after", "subsequent to", "next to", "before", or the like, used herein to describe a temporal relationship between events, operations, or the like are generally intended to include events, situations, cases, operations, or the like that do not occur consecutively unless the terms, such as "directly", "immediately", or the like, are used.

When the terms, such as "first", "second", or the like, are used herein to describe various elements or components, it should be considered that these elements or components are not limited thereto. These terms are merely used herein for distinguishing an element from other elements. Therefore, a first element mentioned below may be a second element in a technical concept of the present disclosure.

The elements or features of various exemplary embodiments of the present disclosure can be partially or entirely bonded to or combined with each other and can be interlocked and operated in technically various ways as can be fully understood by a person having ordinary skill in the art, and the various exemplary embodiments can be carried out independently of or in association with each other.

FIG. 1 illustrates a structure of an organic light emitting display device according to an embodiment of the present disclosure.

Referring to FIG. 1, the organic light emitting display device 100 may include a display panel 110, a data driver 120, a gate driver 130, and a timing controller 140.

The display panel 110 may include a plurality of gate lines (GL1 to GLn) extending in a first direction and a plurality of data lines (DL1 to DLm) extending in a second direction. Here, the first direction and the second direction may intersect each other; embodiments of the present disclosure are not limited thereto.

Further, the display panel 110 may include a plurality of pixels 101. The pixel 101 may be connected to a gate line and a data line, and driven by receiving a data signal provided through the connected data line in response to a gate signal provided through the connected gate line.

The data driver 120 may be connected to the plurality of data lines (DL1 to DLm), and provide data signals to the plurality of pixels through the plurality of data lines (DL1 to DLm). The data driver 120 may include a plurality of source drivers. The plurality of source drivers each may be implemented as an integrated circuit. The data signals provided by the data driver 120 may be applied to the pixels.

The gate driver 130 may be connected to the plurality of gate lines (GL1 to GLm) and provide gate signals to the plurality of gate lines (GL1 to GLn). The pixels to which gate signals are provided through the gate lines may receive data signals.

FIG. 1 illustrates that the gate driver 130 is disposed outside of the display panel 110; however, embodiments of the present disclosure are not limited thereto. For example, the gate driver 130 may include a gate signal generator disposed inside of the display panel 110. Further, the gate driver 130 may be implemented as a plurality of integrated circuits.

Further, FIG. 1 illustrates that the gate driver 130 is disposed on one side of the display panel 110, embodiments of the present disclosure are not limited thereto. For example, a gate driver located on the left side of the display panel 110 may be connected to one or more odd-numbered gate lines, and a gate driver located on the right side of the display panel 110 may be connected to one or more even-numbered gate lines.

The timing controller 140 can control the data driver 120 and the gate driver 130. The timing controller 140 can supply a data control signal to the data driver 120 and a gate control signal to the gate driver 130. The data control signal and the gate control signal may include a clock, a vertical synchronization signal, a horizontal synchronization signal, and a start pulse. However, signals provided from the timing controller 140 according to embodiments of the present disclosure are not limited thereto.

Further, the timing controller 140 may provide image signals to the data driver 120. The data driver 120 may generate data signals using the image signals and one or more data control signals received from the timing controller 140, and provide the data signals to the plurality of data lines.

Figure 2:
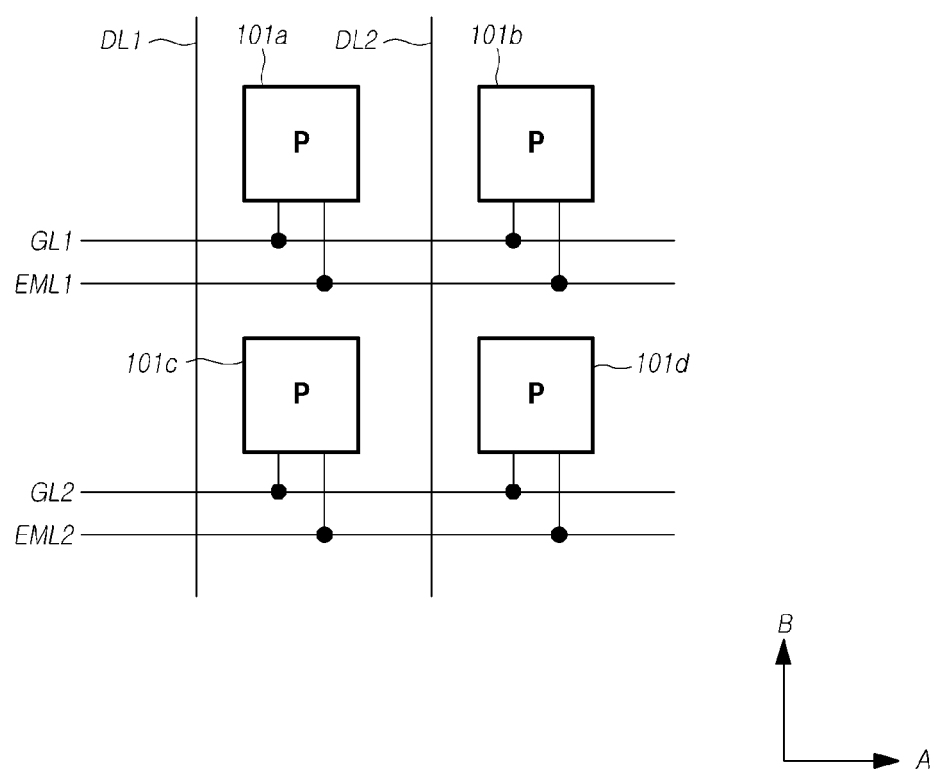
FIG. 2 is a plan view illustrating an arrangement of some pixels in the organic light emitting display device illustrated in FIG. 1 according to an embodiment of the present disclosure.
Figure 3:
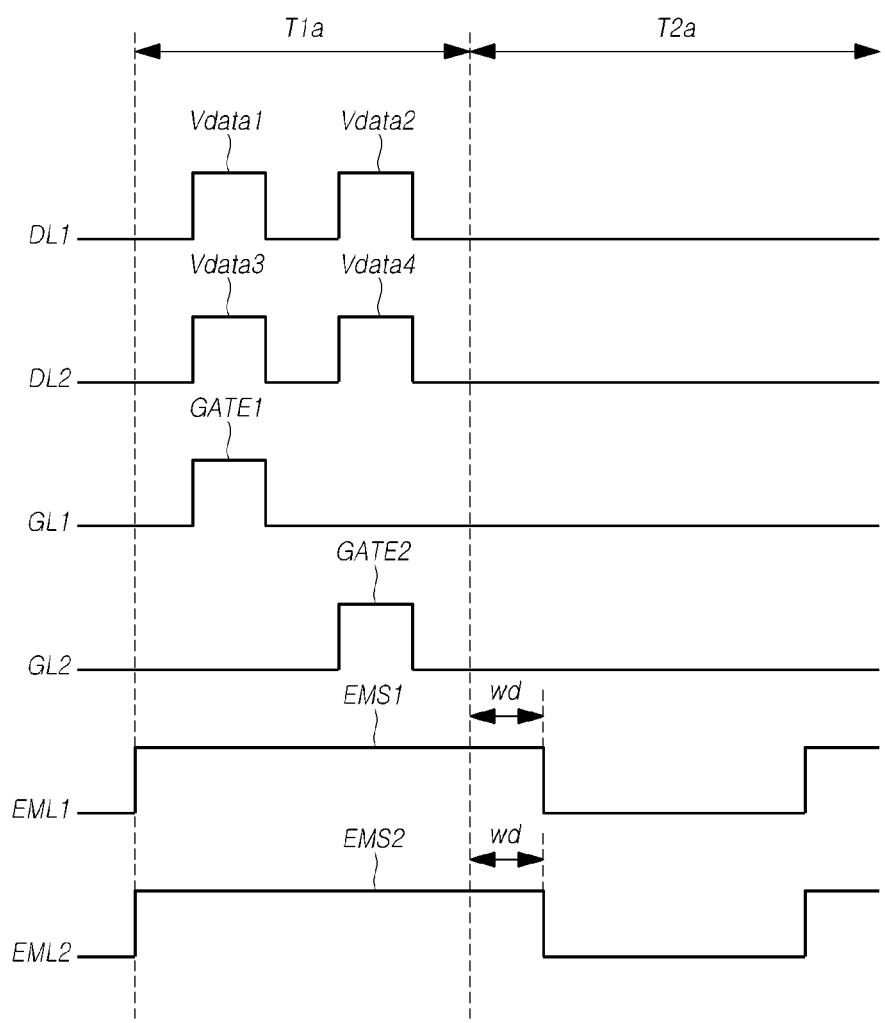
FIG. 3 is a timing diagram illustrating operations of the pixels illustrated in FIG. 2 according to an embodiment of the present disclosure.

FIG. 2 is a plan view illustrating an arrangement of some pixels in the organic light emitting display device illustrated in FIG. 1 according to an embodiment of the present disclosure. FIG. 3 is a timing diagram illustrating operations of the pixels illustrated in FIG. 2 according to an embodiment of the present disclosure.

Referring to FIGS. 2 and 3, a first pixel 101a, a second pixel 101b, a third pixel 101c, and a fourth pixel 101d of the organic light emitting display device 100 are disposed. Further, in the organic light emitting display device 100, a first gate line GL1, a second gate line GL2, a first emission line EML1, and a second emission line EML2 are arranged to extend in a first direction A, and a first data line DL1 and a second data line DL2 are arranged to extend in a second direction B.

Further, the first pixel 101a and the second pixel 101b may be connected to the first gate line GL1, and the third pixel 101c and the fourth pixel 101d may be connected to the second gate line GL2. Further, the first pixel 101a and the third pixel 101c may be connected to the first data line DL1, and the second pixel 101b and the fourth pixel 101d may be connected to the second data line DL2. Further, the first pixel 101a and the second pixel 101b may be connected to the first emission line EML1, and the third pixel 101c and the fourth pixel 101d may be connected to the second emission line EML2.

In a first period T1a, a first data voltage Vdata1 and a second data voltage Vdata2 may be sequentially provided to the first data line DL1, and a third data voltage Vdata3 and a fourth data voltage Vdata4 may be sequentially provided to the second data line DL2. At this time, a first gate signal GATE1 and a second gate signal GATE2 may be sequentially provided to the first gate line GL1 and the second gate line GL2.

The first data voltage Vdata1 and the third data voltage Vdata3 may be provided, according to the first gate signal GATE1, to the first pixel 101a and the second pixel 101b, respectively, and the second data voltage Vdata2 and the fourth data voltage Vdata4 may be provided, according to the second gate signal GATE2, to the third pixel 101c and the fourth pixel 101d, respectively.

In a second period T2a, the first pixel 101a, the second pixel 101b, the third pixel 101c, and the fourth pixel 101d can emit light by a first emission signal EMS1 and a second emission signal EMS2 provided through the first emission line EML1 and the second emission line EML2. Here, since a time at which the first pixel 101a, the second pixel 101b, the third pixel 101c, and the fourth pixel 101d emit light can be adjusted by pulse widths of the first emission signal EMS1 and the second emission signal EMS2 in the second period T2a, the luminance of the first pixel 101a, the second pixel 101b, the third pixel 101c, and the fourth pixel 101d can be adjusted by the pulse widths of the first emission signal EMS1 and the second emission signal EMS2 in the second period T2a.

Figure 4:
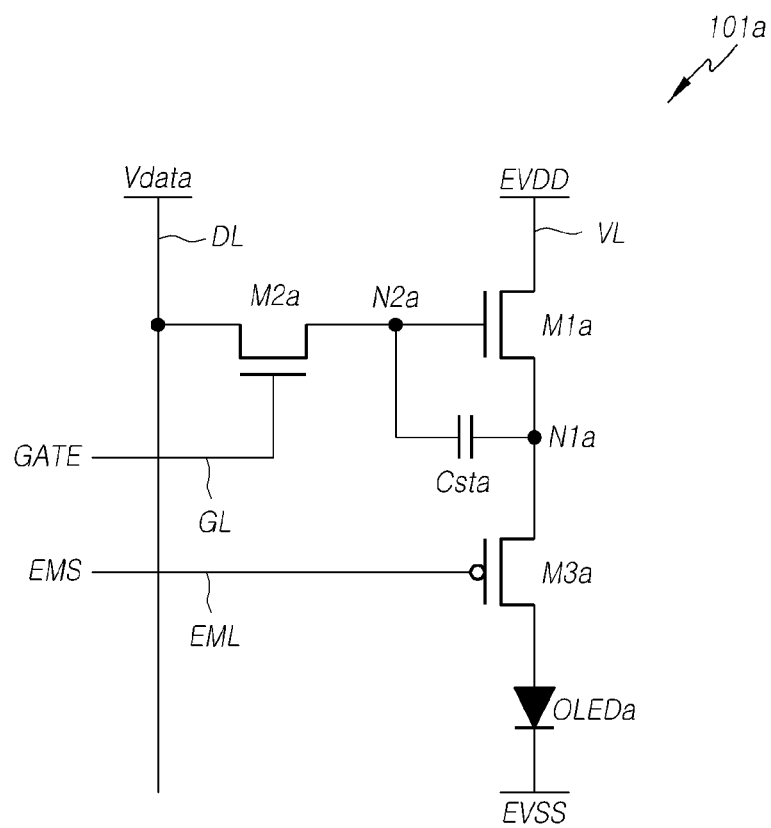
FIG. 4 is a circuit diagram illustrating a pixel according to an embodiment of the present disclosure.

FIG. 4 is a circuit diagram illustrating a pixel according to an embodiment of the present disclosure.

Referring to FIG. 4, a pixel 101 (e.g., the first pixel 101a) may include a first transistor M1a, a second transistor M2a, a third transistor M1a, a storage capacitor Csta and an organic light emitting diode OLEDa.

A first electrode of the first transistor M1a may be connected to a power supply line VL through which a first power source EVDD is provided, and a second electrode thereof may be connected to a first node N1a. A gate electrode of the first transistor M1a may be connected to a second node N2a. A driving current generated by receiving the first power supply EVDD in response to the voltage transmitted to the gate electrode of the first transistor M1a may flow through the organic light emitting diode OLEDa by the emission signal EMS.

A first electrode of the second transistor M2a may be connected to a data line DL for providing a data voltage Vdata, and a second electrode thereof may be connected to the second node N2a. A gate electrode of the second transistor M2a may be connected to a gate line GL for providing a gate signal GATE. The second transistor M2a may allowing a data voltage provided through the data line DL to be provided to the gate electrode of the first transistor M1a in response to a received gate signal. The gate line GL may be connected to the gate driver 130 shown in FIG. 1, and receive a gate signal from the gate driver 130.

A first electrode of the third transistor M3a may be connected to the first node N1a, and a second electrode thereof may be connected to an organic light emitting diode OLEDa. Further, a gate node of the third transistor M3a may be connected to the emission line EML for providing an emission signal EMS. The emission line EML may be connected to the gate driver 130 shown in FIG. 1, and receive an emission signal EMS from the gate driver 130.

A first electrode of a storage capacitor Csta may be connected to the first node N1a, and a second electrode thereof may be connected to the second node N2a. That is, the storage capacitor Csta may be disposed between the gate electrode and the second electrode of the first transistor M1a, and may cause a voltage between the gate electrode and the second electrode of the first transistor M1a to be remained at a predetermined level.

An anode electrode of the organic light emitting diode OLEDa may be connected to a second electrode of the third transistor M3a, and a cathode electrode thereof may be connected to a second power supply source EVSS. A voltage level of the second power supply source EVSS may be lower than that of the first power supply EVDD. The organic light emitting diode OLEDa can emit light according to a current flowing from the anode electrode to the cathode electrode. The organic light emitting diode OLEDa may include a light emitting layer emitting by the current flowing from the anode electrode to the cathode electrode. The light emitting layer may be an organic film or an inorganic film.

In the pixel 101 as described above, although the first transistor M1a and the second transistor M2a are represented as n-type MOS transistors, and the third transistor M3a is represented as a p-type MOS transistor, embodiments of the present disclosure are not limited thereto. Further, the first electrodes and the second electrodes of the first transistor M1a, the second transistor M2a, and the third transistor M3a may be drain electrodes and source electrodes, respectively. However, embodiments of the present disclosure are not limited thereto.

In the pixel 101 as described above, when the second transistor M2a and the third transistor M3a are turned off, the second node N1a may be floated. In particular, in the first period T1a as shown in FIG. 3, when the second transistor M2a is turned off as a gate signal GATE is not provided, and the third transistor M3a is turned off as an emission signal is provided, a data voltage provided to another pixel may be applied to the data line DL. A voltage in the second node N2a may be fluctuated by the data voltage provided to the data line DL, and thus, there is a possibility that image quality may be deteriorated.

Figure 5:
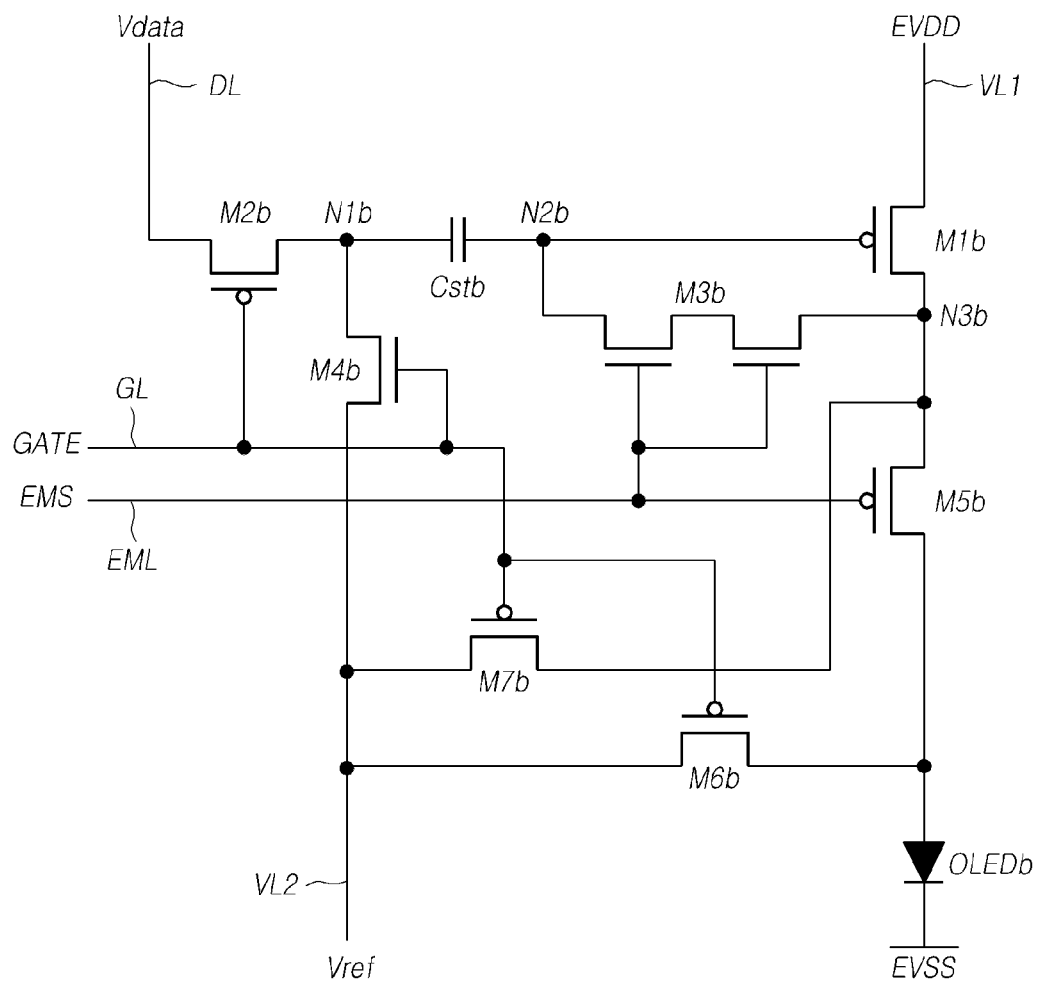
FIG. 5 is a circuit diagram illustrating a pixel according to an embodiment of the present disclosure.
Figure 6:
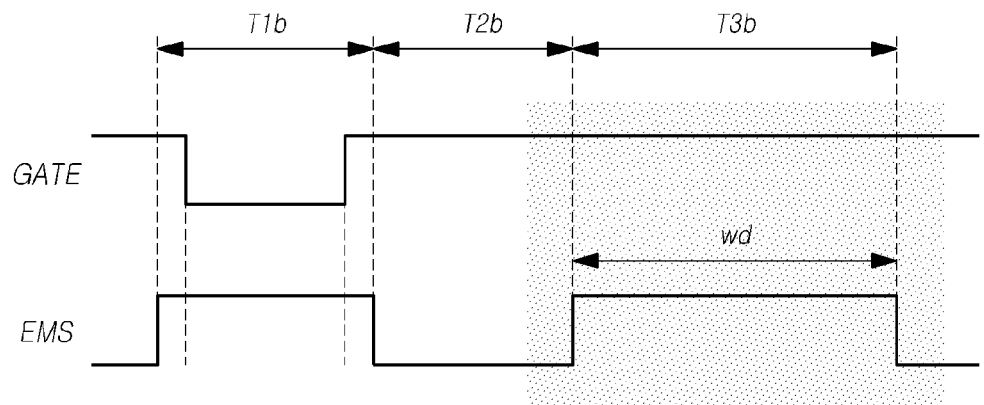
FIG. 6 is a timing diagram illustrating an operation of the pixel illustrated in FIG. 5 according to an embodiment of the present disclosure.

FIG. 5 is a circuit diagram illustrating a pixel according to an embodiment of the present disclosure. FIG. 6 is a timing diagram illustrating an operation of the pixel illustrated in FIG. 5 according to an embodiment of the present disclosure.

Referring to FIGS. 5 and 6, a pixel 101 may perform operations in a first period T1b in which a data voltage Vdata is applied, a second period T2b in which the data voltage Vdata is remained, and an organic light emitting diode OLEDb emits light by a driving current according to the data voltage Vdata, and a third period T3b in which the data voltage Vdata is remained, and the organic light emitting diode OLEDb does not emit light. Further, a ratio between a length of the second period T2b and a length of the third period T3b may be adjusted and preset voltages at the second period T2b and the third period T3b may be provided to the pixel 101. The ratio between a length of the second period T2b and a length of the third period T3b may be adjusted by a pulse width wd of an emission signal EMS.

The pixel 101 may receive preset voltages through the first node N1b in the second period T2b and the third period T3b. The pixel 101b may include a first transistor M1b providing a driving current according to a voltage in a second node N2b, a storage capacitor Cstb which includes a first electrode connected to the first node N1b and a second electrode connected to the second node N2b and to which a data voltage Vdata is applied through the first node N1b and a threshold voltage of the first transistor M1b is applied through the second node N2b, in the first period T1b, and an organic light emitting diode OLEDb to which a driving current is provided in the second period T2b and is not provided in the third period T3b.

A first electrode and a second electrode of the first transistor M1b may be connected to a first power supply line VL1 and a third node N3b, respectively. Further, a gate electrode of the first transistor M1a may be connected to the second node N2b. Accordingly, the first transistor M1b can cause a driving current to flow through the third node N3b according to a voltage applied to the second node N2b.

The first and second electrodes of the storage capacitor Cstb may be connected to the first node N1b and the second node N2b, respectively. According to a data voltage Vdata applied to the first electrode and a threshold voltage of the first transistor M1b applied to the second electrode, the storage capacitor Cstb can store a voltage corresponding to the data voltage Vdata and the threshold voltage of the first transistor M1b. Further, to prevent the first node N1b connected to the storage capacitor Cstb from being floated, a preset voltage may be provided to the first node N1b. For example, the preset voltage may be a reference voltage Vref.

A driving current may be provided to the organic light emitting diode OLEDb through the anode electrode, and the cathode electrode may be connected to a second power source EVSS. The organic light emitting diode OLEDb can emit light depending on a magnitude of the driving current.

Further, the pixel 101 may further include a second transistor M2b, a third transistor M3b, a fourth transistor M4b and a fifth transistor M5b.

First and second electrodes of the second transistor M2b may be connected to a data line and the first node N1b, respectively. Further, a gate electrode of the second transistor M2b may be connected to a gate line GL. The second transistor M2b can cause a data voltage Vdatab to be applied to the first node N1b in the first period T1b.

First and second electrodes of the third transistor M3b may be connected to the third node N3b and the second node N2b, respectively. Further, a gate electrode of the third transistor M3b may be connected to an emission line EML. Further, third transistor M3b may have a double gate electrode. The third transistor M3b can cause a threshold voltage of the first transistor M1b to be applied to the second node N2b in the first period T1b. The third transistor M3b may be an n-type MOS transistor. Further, the third transistor M3b may include an oxide semiconductor. However, embodiments of the present disclosure are not limited thereto.

First and second electrodes of the fourth transistor M4b may be connected to a second power supply line VL2 through which a reference voltage is applied and the first node N1b, respectively. Further, a gate electrode of the fourth transistor M4b may be connected to the gate line GL. The fourth transistor M4b may be an n-type MOS transistor. Further, the fourth transistor M4b may include an oxide semiconductor. However, embodiments of the present disclosure are not limited thereto.

First and second electrodes of the fifth transistor M5b may be connected to the third node N3b and the anode electrode of the organic light emitting diode OLEDb, respectively. Further, a gate electrode of the fifth transistor M5b may be connected to the emission line EML.

The pixel 101 may further include a sixth transistor M6b. First and second electrodes of the sixth transistor M6b may be connected to the second power supply line VL2 and the anode electrode of the organic light emitting diode OLEDb, respectively. Further, a gate electrode of the sixth transistor M6b may be connected to the gate line GL. The sixth transistor M6b can initialize a voltage applied to the anode electrode of the organic light emitting diode OLEDb by the reference voltage Vref.

Further, the pixel 101 may further include a seventh transistor M7b. First and second electrodes of the seventh transistor M7b may be connected to the second power supply line VL2 and the third node N3b, respectively. Further, a gate electrode of the seventh transistor M7b may be connected to the gate line GL. The seventh transistor M7b can initialize a voltage in the third node N3b by the reference voltage Vref.

Further, in the first period T1b, a gate signal GATE in a low state may be provided and an emission signal in a high state may be provided. When the gate signal GATE is in the low state, the second transistor M2b connected to the gate line GL may be turned on and the fourth transistor M4b may be in an off-state. Further, when the emission signal EMS is in the high state, the third transistor M3b connected to the emission line EML may be turned on and the fifth transistor M5b may be in an off-state.

When the second transistor M2b is turned on, a data voltage Vdata provided through the data line DL is applied to the first node N1b, and thus, the data voltage Vdata can be stored in the storage capacitor Cstb. Since the third transistor M3b is turned on, in turn, diode connecting of the first transistor M1b may cause current to flow from the first electrode of the first transistor M1b to the second electrode thereof. Thus, a voltage according to the current flowing the first electrode of the first transistor M1b to the second electrode thereof may be stored in the second node N2b. The voltage stored in the second node N2b may correspond to a threshold voltage of the first transistor M1b. Accordingly, a voltage corresponding to the data voltage Vdata and the threshold voltage of the first transistor M1b may be stored in the storage capacitor Cstb. Further, since the fifth transistor M5b is remained in an off-state, a current may not flow across the organic light emitting diode OLEDb.

In the second period T2b, the gate signal GATE remains in a high state and the emission signal remains in a low state. In the second period T2b, since voltages corresponding to the data voltage Vdata and the threshold voltage of the first transistor M1b are stored in the first node N1b and the second node N2b, respectively, a driving current corresponding to the data voltage Vdata and the threshold voltage of the first transistor M1b may flow through the third node N3b. Further, the fifth transistor M5b may be turned on by the emission signal EMS provided in the low state, and the driving current may be provided to the organic light emitting diode OLEDb. According to this, a driving current resulted from compensating for the threshold voltage of the first transistor M1b may flow through the organic light emitting diode OLEDb.

In the third period T3b, the gate signal GATE and the emission signal may remain in a high state. When the gate signal GATE and the emission signal remain in the high state, the second transistor M2b may be turned off and the third transistor M3b may be turned on. At this time, since the fifth transistor M5b in the off-state, a current may not flow through the organic light emitting diode OLEDb; thus, the organic light emitting diode OLEDb may not emit light. When the second transistor M2b is in an off-state, the first node N1b may become a floating state, and to prevent the first node N1b from being floated, a preset voltage may be provided to the first node N1b. Further, by adjusting a length of the third period T3b through the adjusting of a pulse width wd of the emission signal EMS, luminance of the organic light emitting diode OLEDb can be adjusted.

In the second period T2b and the third period T3b, when the gate signal GATE in the high state is provided, the fourth transistor M4b is turned on, and by causing the reference voltage Vref applied through the second power supply line VL2 to be provided to the first node N1b, a preset voltage may be applied to the first node N1b.

Accordingly, since the reference voltage Vref is applied to the first node N1b, the first node N1b is prevented from being floated; thus, it is possible to prevent image quality of the organic light emitting display device 100 from being deteriorated.

Further, the pixel 101 may further include a sixth transistor M6b, and the sixth transistor M6b may be connected to the gate line GL and be turned on by a gate signal GATE. Accordingly, the sixth transistor M6b may be turned on by the gate signal GATE in the first period T1b, and initialize a voltage applied to the anode electrode of the organic light emitting diode OLEDb in the third node N3b.

Further, the pixel 101 may further include a seventh transistor M7b, and the seventh transistor M7b may be connected to the gate line GL and be turned on by a gate signal GATE. Accordingly, the seven transistor M7b may be turned on by the gate signal GATE in the first period T1b, and initialize a voltage applied to the anode electrode of the organic light emitting diode OLEDb.

Figure 7:
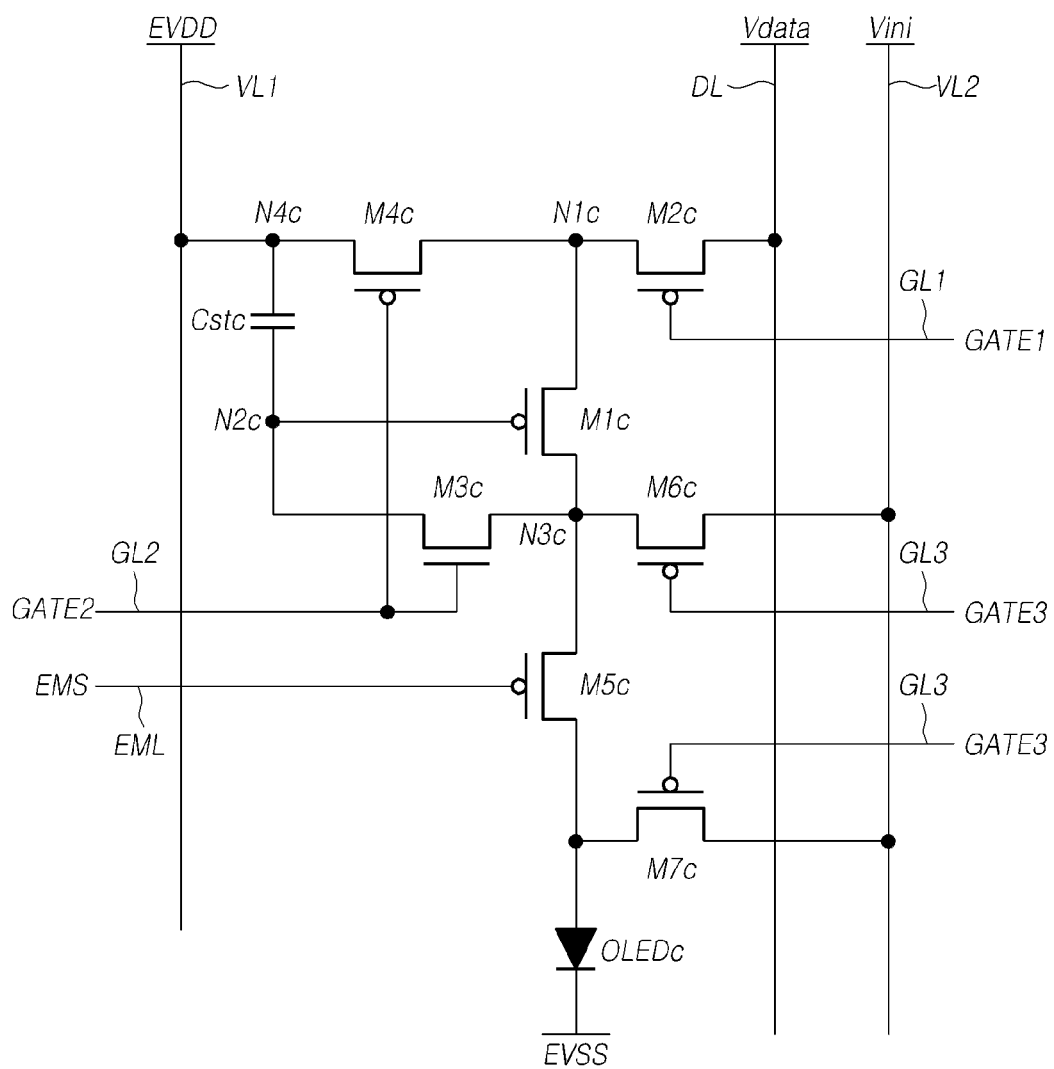
FIG. 7 is a circuit diagram illustrating a pixel according to an embodiment of the present disclosure.

FIG. 7 is a circuit diagram illustrating a pixel according to an embodiment of the present disclosure.

Referring to FIG. 7, a pixel 101 may perform operations in a first period T1c in which a data voltage Vdata is applied, a second period T2c in which the data voltage Vdata is remained, and an organic light emitting diode OLEDb emits light by a driving current according to the data voltage Vdata, and a third period T3c in which the data voltage Vdata is remained, and the organic light emitting diode OLEDb does not emit light. Further, a ratio between a length of the second period T2c and a length of the third period T3c may be adjusted and preset voltages at the second period T2c and the third period T3c may be provided to the pixel 101. The ratio between a length of the second period T2c and a length of the third period T3c may be adjusted by a pulse width wd of an emission signal EMS.

The pixel 101 may receive preset voltages through the first node N1c in the second period T2c and the third period T3c. The pixel 101 may include a first transistor M1c providing a driving current from the first node N1c to the third node N3c according to a voltage in a second node N2c, a storage capacitor Cstc which includes a first electrode connected to the fourth node N4c and a second electrode connected to the second node N2c and to which a data voltage Vdata is applied through the fourth node N4c and a threshold voltage of the first transistor M1c is applied through the second node N2c, in the first period T1c, and an organic light emitting diode OLEDb to which a driving current is provided in the second period T2c and is not provided in the third period T3c.

A first electrode and a second electrode of the first transistor M1c may be connected to the first node N1c and the third node N3c, respectively. Further, a gate electrode of the first transistor M1c may be connected to the second node N2c. Accordingly, the first transistor M1c can cause a driving current to flow through the third node N3c according to a voltage applied to the second node N2c.

The first and second electrodes of the storage capacitor Cstc may be connected to the fourth node N4c and the second node N2c, respectively. According to a data voltage Vdata applied to the first electrode and a threshold voltage of the first transistor M1c applied to the second electrode, the storage capacitor Cstc can store a voltage corresponding to the data voltage Vdata and the threshold voltage of the first transistor M1c.

A driving current may be provided to the organic light emitting diode OLEDc through an anode electrode thereof, and a cathode electrode thereof may be connected to a second power source EVSS. The organic light emitting diode OLEDc can emit light depending on a magnitude of the driving current.

Further, the pixel 101 may further include a second transistor M2c, a third transistor M3c, a fourth transistor M4c and a fifth transistor M5c.

First and second electrodes of the second transistor M2c may be connected to a data line DL and the first node N1c, respectively. Further, a gate electrode of the second transistor M2c may be connected to a first gate line GL1. The second transistor M2c can cause a data voltage Vdatab to be applied to the first node N1c.

First and second electrodes of the third transistor M3c may be connected to the third node N3c and the second node N2c, respectively. Further, a gate electrode of the third transistor M3c may be connected to a second gate line GL2. The third transistor M3c can cause a threshold voltage of the first transistor M1c to be applied to the second node N2c in the first period T1c. The third transistor M3c may be an n-type MOS transistor. Further, the third transistor M3c may include an oxide semiconductor. However, embodiments of the present disclosure are not limited thereto.

First and second electrodes of the fourth transistor M4c may be connected to the fourth node N4c and the first node N1c, respectively. Further, a gate electrode of the fourth transistor M4c may be connected to the second gate line GL2.

First and second electrodes of the fifth transistor M5c may be connected to the third node N3c and the anode electrode of the organic light emitting diode OLEDc, respectively. Further, a gate electrode of the fifth transistor M5c may be connected to an emission line EML.

The pixel 101 may further include a sixth transistor M6c. First and second electrodes of the sixth transistor M6c may be connected to a second power supply line VL2 for providing an initialization voltage Vini and the third node N3c, respectively. Further, a gate electrode of the sixth transistor M6c may be connected to a third gate line GL3. The sixth transistor M6c can initialize a voltage applied in the third node N3c by the initialization voltage in the first period T1c.

Further, the pixel 101 may further include a seventh transistor M7c. First and second electrodes of the seventh transistor M7c may be connected to the second power supply line VL2 and the anode electrode of the organic light emitting diode OLEDc, respectively. Further, a gate electrode of the sixth transistor M7c may be connected to the third gate line GL3. The seventh transistor M7c can initialize a voltage applied to the anode electrode of the organic light emitting diode OLEDc by the initialization voltage Vini.

Figure 8:
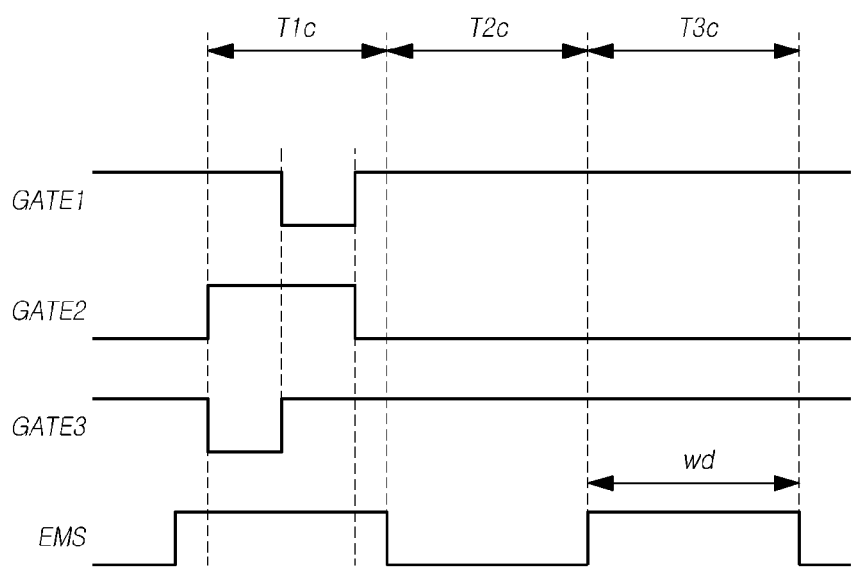
FIG. 8 is a timing diagram illustrating an operation of the pixel illustrated in FIG. 7 according to an embodiment of the present disclosure.

FIG. 8 is a timing diagram illustrating operations of the pixel illustrated in FIG. 7 according to an embodiment of the present disclosure.

Referring to FIG. 8, a second gate signal GATE2 and an emission signal EMS which are in a high state may be provided in the first period T1c. Further, in the first period T1c, a first gate signal GATE1 may be varied from a high state to a low state, and a third gate signal GATES may be varied from a low state to a high state. Further, in the first period T1c, the first gate signal GATE1 may become the high state again, and the second gate signal GATE2 may become a low state.

When the second gate signal GATE2 becomes the high state, the third transistor M3c may become an on-state, the fourth transistor may become an off-state. The sixth transistor M6c and the seventh M7c may be turned on by the third gate signal GATES, and the third node N3c and the anode electrode of the organic light emitting diode OLEDc may be initialized by an initialization voltage Vini.

After the third node N3c and the anode electrode of the organic light emitting diode OLEDc are initialized by the initialization voltage Vini, the first gate signal GATE1 in the low state may be provided. When the first gate signal GATE1 in the low state is provided, the second transistor M2c may be turned on. When the second transistor M2c is turned on, a data voltage Vdata applied to the data line DL may be provided to the first node N1c. Here, since the third transistor M3c is remained in the turn-on state, diode connecting of the first transistor M1c may be performed. Thus, a current may flow through the third node N3c by the first transistor M1c. At this time, a voltage corresponding to a data voltage Vdata and a threshold voltage of the first transistor M1c may be remained at the second node N2c connected to the gate electrode of the first transistor M1c. Since the emission signal remains the high state, the fifth transistor M5c is in an off-state; thus, a current cannot flow through the organic light emitting diode OLEDc.

When the emission signal EMS remains the high state in the first period T1c, in case all of the first transistor M1c, the second transistor M2c, the third transistor M3c, the fourth transistor M4c, the fifth transistor M5c, the sixth transistor M6c, and the seventh transistor M7c are turned off, there is a possibility that the first node N1c may be floated. However, in the first period T1c, when the first gate signal GATE1 is varied to the high state, since the second gate signal GATE2 is varied from the high state to the low state, the fourth transistor M4c may be turned on by the second gate signal GATE2. Accordingly, a voltage of the first power source EVDD that is a preset voltage may be applied to the first node N1c.

In the second period T2c, the emission signal EMS may become a low state. When the emission signal EMS becomes the low state, since the fourth transistor M4c is turned on and remained in the on-state, a driving current flowing from the first node N1c to the third node N3c may be provided to the organic light emitting diode OLEDc. At this time, since a voltage corresponding to a data voltage Vdata and a threshold voltage of the first transistor M1c is stored in the storage capacitor Cstc, the driving current resulted from compensating for the threshold voltage may flow.

In the third period T3c, the emission signal EMS may become the high state again. When the emission signal EMS becomes the high state, the organic light emitting diode may not emit light as the driving current is not provided to the organic light emitting diode OLEDc. Since luminescence of the organic light emitting diode OLEDc corresponds to a time at which the organic light emitting diode OLEDc emits light, the luminescence of the organic light emitting diode OLEDc can be adjusted by adjusting a pulse width wd of the emission signal EMS. Embodiments related to the adjusting of the organic light emitting diode OLEDc are not limited thereto.

Figure 9:
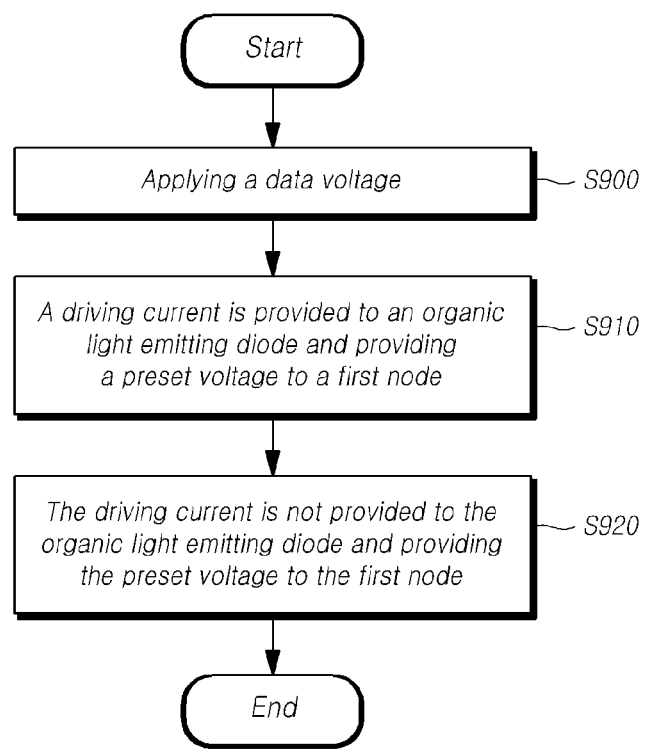
FIG. 9 is a flow diagram illustrating a method of driving the organic light emitting display device according to an embodiment of the present disclosure.

FIG. 9 is a flow diagram illustrating a method of driving the organic light emitting display device according to an embodiment of the present disclosure.

Referring to FIG. 9, in a method of driving an organic light emitting display device, the organic light emitting display device may include a pixel for providing a driving current to an organic light emitting diode according to an applied data voltage.

In the organic light emitting display device, a data voltage may be applied to a first node, at step S900. Since a plurality of pixels is connected to one data line, a plurality of data voltages may be sequentially applied through one data line during one frame period, in the organic light emitting display device. In response to gate signals, data voltages sequentially applied to the data lines may be sequentially provided to the pixels connected to the data lines.

Each pixel includes a first node at which a data voltage is provided, and the data voltage applied to each pixel may be provided to the first node. Each pixel may include a transistor for providing a data voltage in response to a gate signal.

A data voltage may be provided to the organic light emitting diode according to an applied data voltage, and a preset voltage may be provided to the first node, at step S910. The organic light emitting diode can emit light when a current flows through the organic light emitting diode. Since the first node is connected between the data line and the transistor, when the transistor is turned off, the first node may become a floating state. In case the first node is in the floated state, even when a connection with the data line is disconnected, since the first node is coupled with the data line, another data voltage applied through the data line can change a voltage level in the first node. Accordingly, by applying a preset voltage to the first node, the variation of a voltage in the first node may be prevented. The preset voltage may be a voltage of a first power supply or a reference voltage. However, embodiments of the present disclosure are not limited thereto.

An applied data voltage may be remained, and a driving current is not provided to the organic light emitting diode, and a preset voltage may be provided to the first node, at step S920. By adjusting a time at which the driving current is not provided to the organic light emitting diode, the luminescence of the organic light emitting diode can be adjusted. Further, the time at which the driving current is not provided to the organic light emitting diode may be adjusted by a pulse width of an emission signal provided through an emission line.

The above description has been presented to enable any person skilled in the art to make and use the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. Although the exemplary embodiments have been described for illustrative purposes, a person skilled in the art will appreciate that various modifications and applications are possible without departing from the essential characteristics of the present disclosure. For example, the specific components of the exemplary embodiments may be variously modified. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure is to be construed according to the claims, and all technical ideas within the scope of the claims should be interpreted as being included in the scope of the present disclosure.

What is claimed is:

1. An organic light emitting display device comprising:
a display panel including a plurality of data lines, a plurality of gate lines, a plurality of emission lines, and a plurality of pixels;
a data driver applying data signals to the plurality of data lines;
a gate driver applying gate signals and emission signals to the plurality of gate lines and the plurality of emission lines, respectively; and
a timing controller controlling the data driver and the gate driver;
a first transistor providing a driving current from a first node to a third node according to a voltage in a second node;
a second transistor having a gate electrode, a first electrode, and a second electrode connected to a first gate line of the plurality of gate lines, one of the plurality of data lines, and the first node, respectively;
a third transistor having a gate electrode, a first electrode, and a second electrode connected to a second gate line of the plurality of gate lines, the third node, and the second node, respectively, and allowing a threshold voltage of the first transistor to be applied to the second node in a first period while a first gate signal with a turn-on voltage level is applied to the second transistor through the first gate line; and
a fourth transistor having a gate electrode, a first electrode, and a second electrode connected to the second gate line, a fourth node, and the first node, respectively, and allowing a preset voltage to be applied to the first node when the fourth transistor is turned on,
wherein the third transistor and the fourth transistor operate together by a second gate signal through the second gate line,
wherein at least one pixel of the plurality of pixels operates in the first period in which a data voltage is applied, a second period in which the data voltage is remained and the driving current is provided according to the data voltage, and a third period in which the data voltage is remained and light emitting is not performed, and
wherein a ratio between a length of the second period and a length of the third period is adjusted, and the at least one pixel receives the preset voltage in the second period and the third period.

2. The organic light emitting display device according to claim 1, wherein the preset voltage is provided to the first node of the at least one pixel in the second period and the third period.

3. The organic light emitting display device according to claim 2, further comprising:
a storage capacitor which includes a first electrode connected to the first node and a second electrode connected to the second node, wherein the data voltage is applied to the first electrode of the storage capacitor through the first node and the threshold voltage of the first transistor is applied to the second electrode of the storage capacitor through the second node, in the first period; and
an organic light emitting diode to which the driving current is provided in the second period and is not provided in the third period.

4. The organic light emitting display device according to claim 3, wherein the at least one pixel comprises:
a fifth transistor providing the driving current to the organic light emitting diode in the second period,
wherein the second transistor provides the data voltage to the first node in the first period, and
wherein the fourth transistor provides the preset voltage to the first node in the third period.

5. The organic light emitting display device according to claim 4, further comprising:
a sixth transistor providing the preset voltage to an anode electrode of the organic light emitting diode in the first period.

6. The organic light emitting display device according to claim 5, further comprising:
a seventh transistor providing the preset voltage to the third node connected to a second electrode of the first transistor in the first period when driving current flows from a first electrode of the first transistor to the second electrode of the first transistor.

7. The organic light emitting display device according to claim 4, wherein the second transistor is turned on in the first period by receiving a gate signal and turned off in the second period and the third period,
wherein the fourth transistor is turned off in the first period by receiving the gate signal and turned on in the second period and the third period, and
wherein the fifth transistor is turned off in the first period and the third period by receiving the emission signal and turned on in the second period.

8. The organic light emitting display device according to claim 7, wherein the third transistor or the fourth transistor includes an oxide semiconductor.

9. The organic light emitting display device according to claim 2, further comprising:
a storage capacitor which includes a first electrode connected to the fourth node providing the preset voltage and a second electrode connected to the second node, wherein the data voltage is applied to the first electrode of the storage capacitor through the fourth node and the threshold voltage of the first transistor is applied to the second electrode of the storage capacitor through the second node, in the first period; and
an organic light emitting diode to which the driving current is provided in the second period and is not provided in the first period and the third period.

10. The organic light emitting display device according to claim 9, further comprising:
a fifth transistor applying the driving current to the organic light emitting diode in the second period,
wherein the second transistor provides the data voltage to the first node in the first period,
wherein the third transistor provides the preset voltage to the first node in the third period, and
wherein the fourth transistor applies the data voltage and the threshold voltage of the first transistor to the second node in the first period.

11. The organic light emitting display device according to claim 10, further comprising:
a sixth transistor providing an initialization voltage to the third node in an initialization period; and a seventh transistor providing the initialization voltage to an anode electrode of the organic light emitting diode in the initialization period.

12. The organic light emitting display device according to claim 10, wherein the second transistor is turned on in the first period by receiving the first gate signal and turned off in the second period and the third period,
wherein the third transistor is turned off in the first period by receiving the second gate signal and turned on in the second period and the third period,
wherein the fourth transistor is turned on in the first period by receiving the second gate signal and turned off in the second period and the third period, and
wherein the fifth transistor is turned off in the first period and the third period by receiving an emission signal and turned on in the second period.

13. The organic light emitting display device according to claim 12, wherein the fourth transistor includes an oxide semiconductor.

14. A method of driving an organic light emitting display device including a pixel providing a driving current to an organic light emitting diode according to an applied data voltage, the method comprising:
applying a data voltage to a first node;
providing the driving current to the organic light emitting diode according to the applied data voltage;
providing a preset voltage to the first node; and
while the applied data voltage is remained and the driving current is not provided to the organic light emitting diode, providing the preset voltage to the first node,
wherein the organic light emitting display device comprises:
a first transistor providing the driving current from the first node to a third node according to a voltage in a second node;
a second transistor having a gate electrode, a first electrode, and a second electrode connected to a first gate line of the plurality of gate lines, one of the plurality of data lines, and the first node, respectively;
a third transistor having a gate electrode, a first electrode, and a second electrode connected to a second gate line of the plurality of gate lines, the third node, and the second node, respectively, and allowing a threshold voltage of the first transistor to be applied to the second node in a first period while a first gate signal with a turn-on voltage level is applied to the second transistor through the first gate line; and
a fourth transistor having a gate electrode, a first electrode, and a second electrode connected to the second gate line, a fourth node and the first node, respectively, and allowing the preset voltage to be applied to the first node when the fourth transistor is turned on; and
wherein the third transistor and the fourth transistor operate together by a second gate signal through the second gate line.

15. The method according to claim 14, wherein the first node provides the data voltage or the preset voltage in response to a gate signal.

16. The method according to claim 14, further comprising:
adjusting luminescence of the pixel by adjusting a length of a time at which the driving current is provided to the organic light emitting diode.

17. The method according to claim 14, further comprising:
adjusting a length of a time at which the driving current is provided to the organic light emitting diode by adjusting a pulse width of an emission signal provided to the pixel.

\* \* \* \* \*